(12) United States Patent
Lee et al.

(10) Patent No.: US 11,011,430 B2
(45) Date of Patent: May 18, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Zhi-Cheng Lee, Tainan (TW); Kai-Lin Lee, Kinmen County (TW); Wei-Jen Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/726,201

(22) Filed: Dec. 23, 2019

(65) Prior Publication Data
US 2020/0135582 A1    Apr. 30, 2020

Related U.S. Application Data

(62) Division of application No. 16/052,600, filed on Aug. 1, 2018, now Pat. No. 10,566,244.

(30) Foreign Application Priority Data

Jul. 2, 2018    (TW) .................... 107122765

(51) Int. Cl.
| | |
|---|---|
| *H01L 21/8234* | (2006.01) |
| *H01L 27/088* | (2006.01) |
| *H01L 21/8238* | (2006.01) |
| *H01L 27/12* | (2006.01) |
| *H01L 27/092* | (2006.01) |
| *H01L 27/108* | (2006.01) |
| *H01L 29/06* | (2006.01) |

(Continued)

(52) U.S. Cl.
CPC ........... *H01L 21/823481* (2013.01); *H01L 21/02271* (2013.01); *H01L 21/823431* (2013.01); *H01L 21/823878* (2013.01); *H01L 27/0886* (2013.01); *H01L 27/0924* (2013.01); *H01L 27/10879* (2013.01); *H01L 27/1211* (2013.01); *H01L 29/0653* (2013.01); *H01L 29/66545* (2013.01)

(58) Field of Classification Search
CPC ......... H01L 21/823481; H01L 27/1211; H01L 27/0924; H01L 27/10879; H01L 27/0886; H01L 29/0653; H01L 21/823878; H01L 21/02271; H01L 29/66545; H01L 21/823431; H01L 29/66795; H01L 29/785; H01L 21/823842; H01L 29/7848; H01L 29/165
See application file for complete search history.

(56) References Cited

U.S. PATENT DOCUMENTS

| | | | |
|---|---|---|---|
| 8,502,316 B2 | 8/2013 | Fung et al. | |
| 8,609,510 B1 * | 12/2013 | Banna | ............... H01L 29/66545 438/424 |

(Continued)

*Primary Examiner* — Thanhha S Pham
(74) *Attorney, Agent, or Firm* — Winston Hsu

(57) ABSTRACT

A method for fabricating semiconductor device includes the steps of: providing a substrate having a first region and a second region; forming a first fin-shaped structure on the first region; forming a first gate structure and a second gate structure on the first fin-shaped structure; using a patterned mask to remove the first gate structure and part of the first fin-shaped structure to form a first trench; and forming a first dielectric layer in the first trench to form a first single diffusion break (SDB) structure and around the second gate structure.

9 Claims, 6 Drawing Sheets

(51) Int. Cl.
*H01L 21/02* (2006.01)
*H01L 29/66* (2006.01)

(56) References Cited

U.S. PATENT DOCUMENTS

| | | |
|---|---|---|
| 9,349,837 B2 | 5/2016 | Ching et al. |
| 9,653,583 B1* | 5/2017 | Zhao ................. H01L 29/66795 |
| 10,008,599 B1 | 6/2018 | Hsu |
| 2013/0140639 A1 | 6/2013 | Shieh et al. |
| 2013/0270620 A1 | 10/2013 | Hu et al. |
| 2014/0015050 A1 | 1/2014 | Tamura |
| 2014/0027820 A1 | 1/2014 | Aquilino et al. |
| 2017/0053980 A1* | 2/2017 | Liou ................... H01L 29/0649 |
| 2017/0243790 A1 | 8/2017 | Xie |
| 2018/0083036 A1* | 3/2018 | Agarwal ......... H01L 21/823821 |

* cited by examiner

SEMICONDUCTOR DEVICE AND METHOD FOR FABRICATING THE SAME

CROSS REFERENCE TO RELATED APPLICATIONS

This application is a division of U.S. application Ser. No. 16/052,600 filed Aug. 1, 2018, and incorporated herein by reference in its entirety.

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region; forming a first gate structure and a second gate structure on the first fin-shaped structure; using a patterned mask to remove the first gate structure and part of the first fin-shaped structure to form a first trench; and forming a first dielectric layer in the first trench to form a first single diffusion break (SDB) structure and around the second gate structure.

According to another aspect of the present invention, a semiconductor device includes: a substrate having a first region and a second region; a first fin-shaped structure on the first region and a second fin-shaped structure on the second region; a first single diffusion break (SDB) structure on the first region; and a second SDB structure on the second region, wherein the first SDB structure and the second SDB structure comprise different heights.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
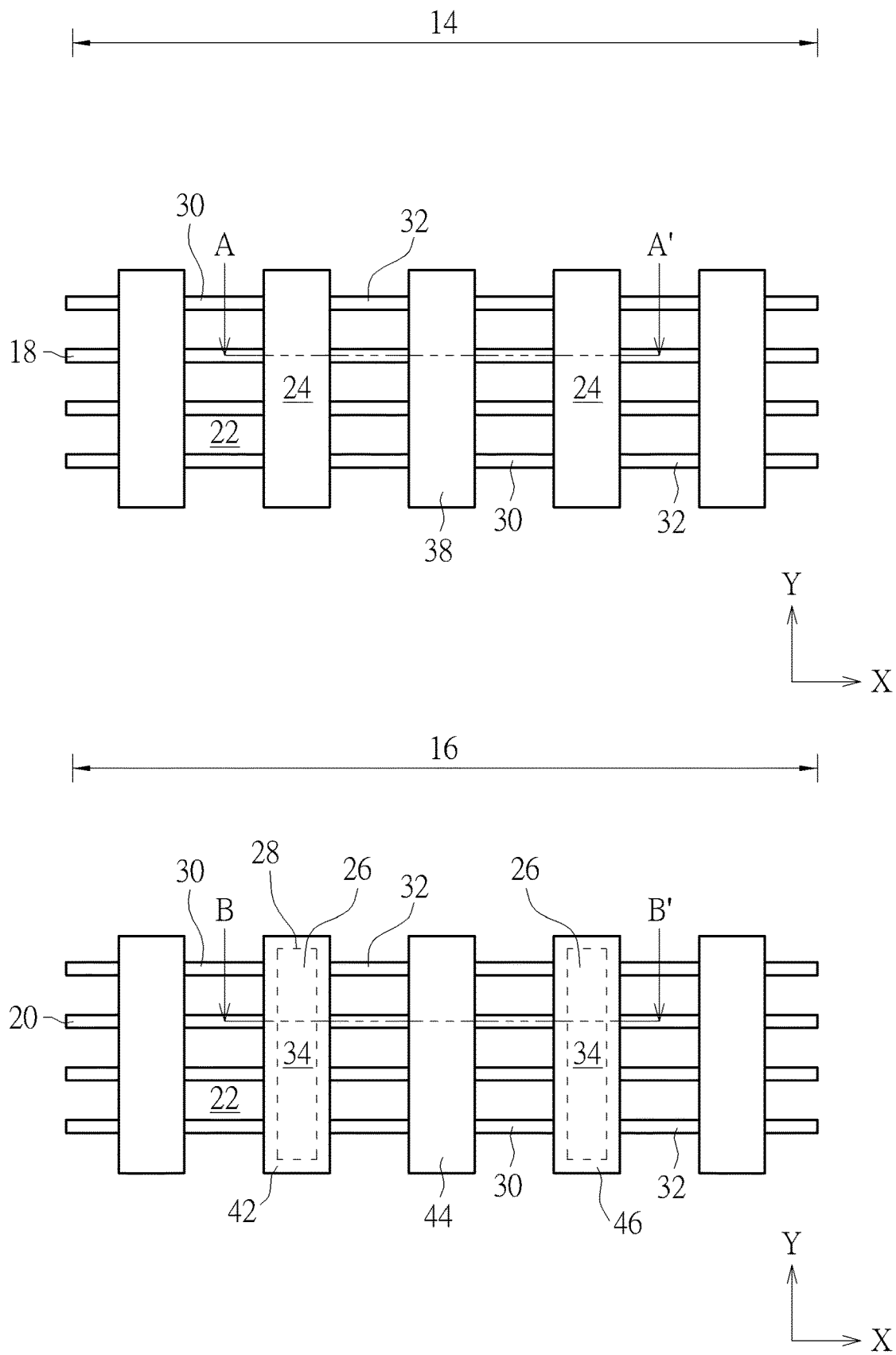
FIG. 1 illustrates a top view of a semiconductor device according to an embodiment of the present invention.
Figure 2:
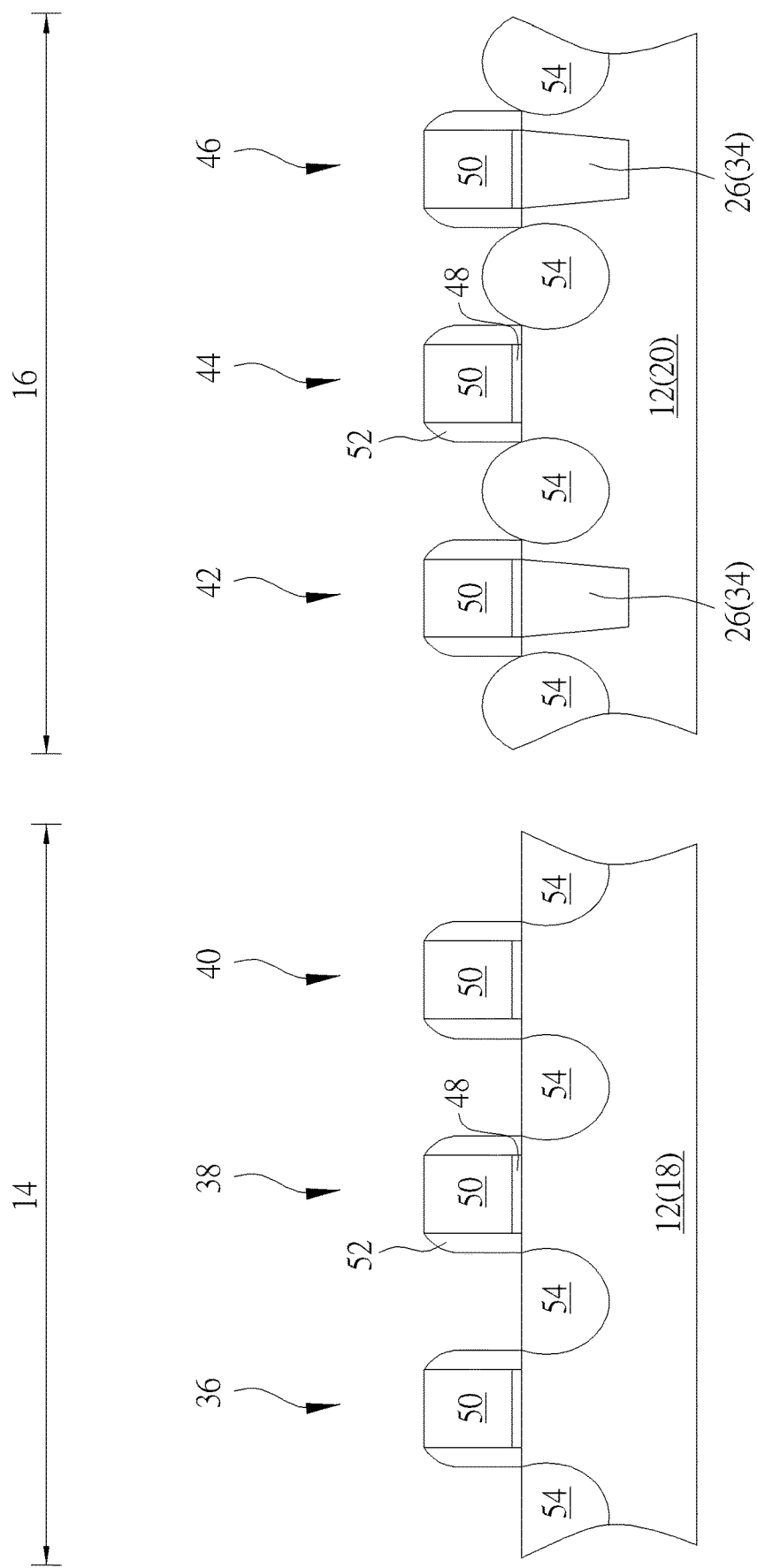
FIGS. 2-6 illustrate a method for fabricating a semiconductor device according to an embodiment of the present invention.

Referring to FIGS. 1-6, FIG. 1 is a top view illustrating a method for fabricating a semiconductor device according to an embodiment of the present invention, and FIGS. 2-6 illustrate a method for fabricating the semiconductor device shown in FIG. 1 according to an embodiment of the present invention, in which the left portions of FIGS. 2-6 are cross-sectional views illustrating a method for fabricating the semiconductor device of FIG. 1 along the sectional line AA', and the right portions of FIGS. 2-6 are cross-sectional views illustrating a method a method for fabricating the semiconductor device of FIG. 1 along the sectional line BB'. As shown in FIGS. 1-2, a substrate 12, such as a silicon substrate or silicon-on-insulator (SOI) substrate is first provided, a first region such as a NMOS region 14 and a second region such as a PMOS region 16 are defined on the substrate 12, and fin-shaped structures 18 are formed on the NMOS region 14 and fin-shaped structure 20 are formed on the PMOS region 16. It should be noted that even though four fin-shaped structures 18, 20 are disposed on each of the transistor regions in this embodiment, it would also be desirable to adjust the number of fin-shaped structures 18, 20 depending on the demand of the product, which is also within the scope of the present invention.

Preferably, the fin-shaped structures 18, 20 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18, 20 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18, 20 could also be accomplished by first forming a patterned hard mask (not shown)

on the substrate 12, and a semiconductor layer composed of silicon germanium is grown from the substrate 12 through exposed patterned hard mask via selective epitaxial growth process to form the corresponding fin-shaped structures 18, 20. These approaches for forming fin-shaped structure are all within the scope of the present invention.

Next, a shallow trench isolation (STI) 22 is formed around the fin-shaped structures 18. In this embodiment, the formation of the STI 22 could be accomplished by conducting a flowable chemical vapor deposition (FCVD) process to form a silicon oxide layer on the substrate 12 and covering the fin-shaped structures 18, 20 entirely. Next, a chemical mechanical polishing (CMP) process along with an etching process are conducted to remove part of the silicon oxide layer so that the top surface of the remaining silicon oxide is slightly lower than the top surface of the fin-shaped structures 18, 20 for forming the STI 22.

Next, at least a single diffusion break (SDB) structure 26 intersecting the fin-shaped structure 20 is formed on the PMOS region 16. In this embodiment, the formation of the SDB structures 26 could be accomplished by first forming a patterned mask (not shown) on the substrate 12 to cover the entire NMOS region 14 and part of the PMOS region 16, and an etching process is conducted by using the patterned mask as mask to remove part of the fin-shaped structure 20 and part of the STI 22 along a direction perpendicular to the extending direction of the fin-shaped structures 20. This forms trenches 28 and at the same time divides each of the fin-shaped structures 20 on the PMOS region 16 into at least two parts. As shown in FIG. 1, each of the trenches 28 formed on the PMOS region 16 preferably divides each of the fin-shaped structures 20 into a first portion 30 on left side of the SDB structures 26 and a second portion 32 on right side of the SDB structures 26, in which the trenches 28 are used to define the position of the SDB structures 26 formed afterwards.

Next, a dielectric layer 34 is formed on the PMOS region 16 to fill the trenches 28 completely, and a planarizing process such as etching back or CMP process is conducted to remove part of the dielectric layer 34 so that the top surface of the remaining dielectric layer 34 is substantially even with the top surface of the fin-shaped structures 20 to form SDB structures 26. In this embodiment, the fin-shaped structures 18, 20 on the NMOS region 14 and PMOS region 16 are disposed along a first direction (such as X-direction) while the SDB structures 26 on the PMOS region 16 are disposed along a second direction (such as Y-direction) orthogonal to the first direction.

Next, gate structures 36, 38, 40, 42, 44, 46 are formed on the fin-shaped structures 18, 20 and SDB structures 24, 26 on the NMOS region 14 and PMOS region 16. In this embodiment, the formation of the gate structure 36, 38, 40, 42, 44, 46 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 36, 38, 40, 42, 44, 46 composed of patterned gate dielectric layer 48 and patterned gate material layer 50 are formed on the substrate 12.

Next, at least a spacer 52 is formed on the sidewalls of each of the gate structures 36, 38, 40, 42, 44, 46, a source/drain region 54 and/or epitaxial layer (not shown) is formed in the substrate 12 adjacent to two sides of the spacer 52, and a selective silicide layer (not shown) could be formed on the surface of the source/drain region 54. In this embodiment, each of the spacer 52 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain region 54 could include dopants and epitaxial material of different conductive type depending on the type of device being fabricated. For example, the source/drain region 54 on the NMOS region 14 could include silicon carbide (SiC) or silicon phosphide (SiP) while the source/drain region 54 on the PMOS region 16 could include silicon germanium (SiGe), but not limited thereto.

Figure 3:
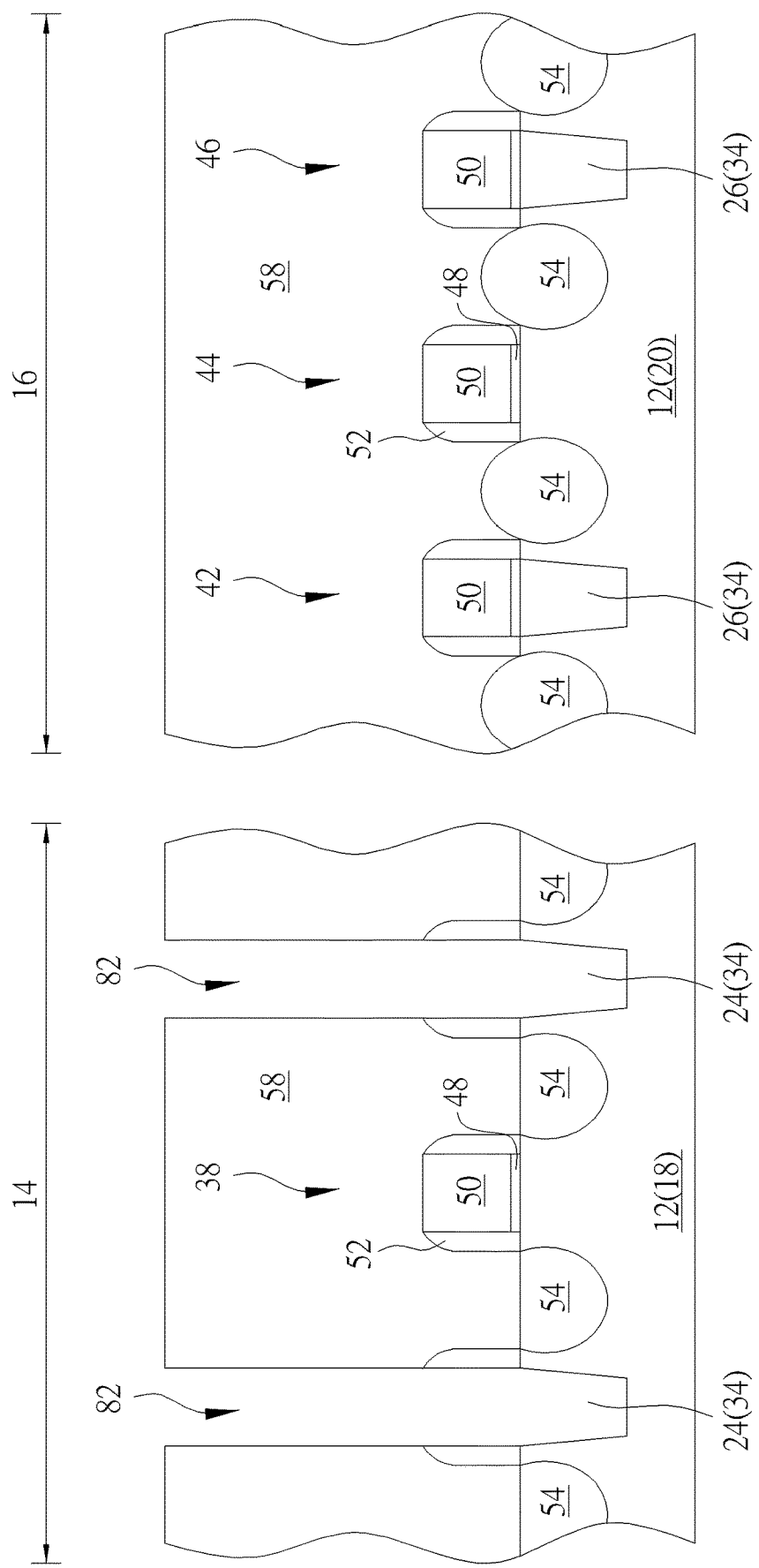

Next, as shown in FIG. 3, a patterned mask 58 is formed on the NMOS region 14 and PMOS region 16, in which the patterned mask 58 preferably covers the gate structure 38 on the NMOS region 14 and all of the gate structures 42, 44, 46 on the PMOS region 16 while exposing top surfaces of the gate structures 36, 40 on the NMOS region 14. Next, an etching process is conducted by using the patterned mask 58 as mask to remove the gate structures 36, 40 and part of the fin-shaped structures 18 to form trenches 82 while the spacers 52 remain intact. Similar to the trenches 28 formed on the PMOS region 16 before forming the SDB structures 26, the trenches 82 formed on the NMOS region 14 at this stage preferably divides each of the fin-shaped structures 18 into a first portion 30 on left side of each of the trenches 82 and a second portion 32 on right side of each of the trenches 82, in which the trenches 82 are used to defined the position of the SDB structures afterwards.

Figure 4:
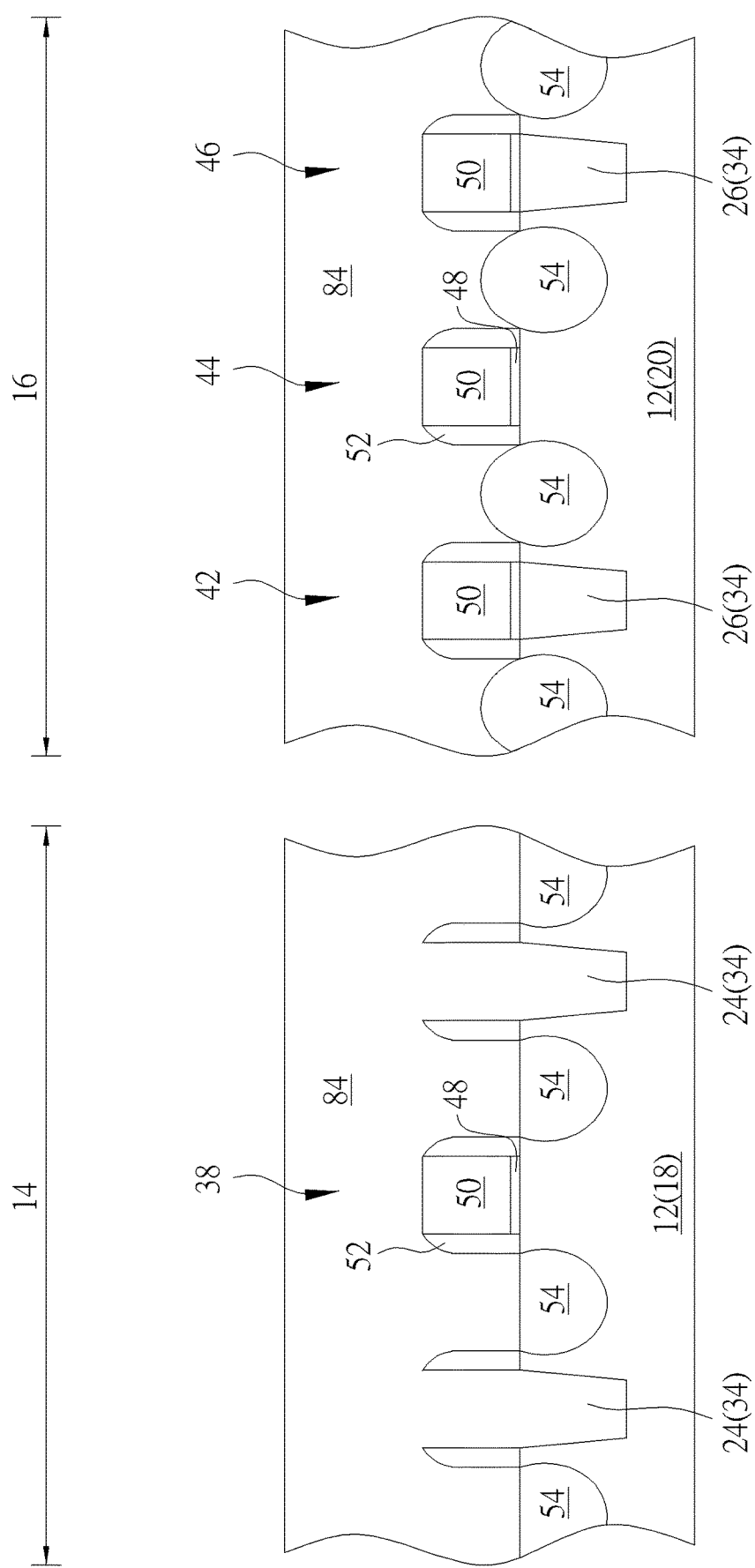

Next, as shown in FIG. 4, the patterned mask 58 is removed completely and a dielectric 84 is formed on the NMOS region 14 and PMOS region 16, in which the dielectric layer 84 preferably fills the trenches 82 and covering the gate structures 38, 42, 44, 46 on NMOS region 14 and PMOS region 16 at the same time.

Figure 5:
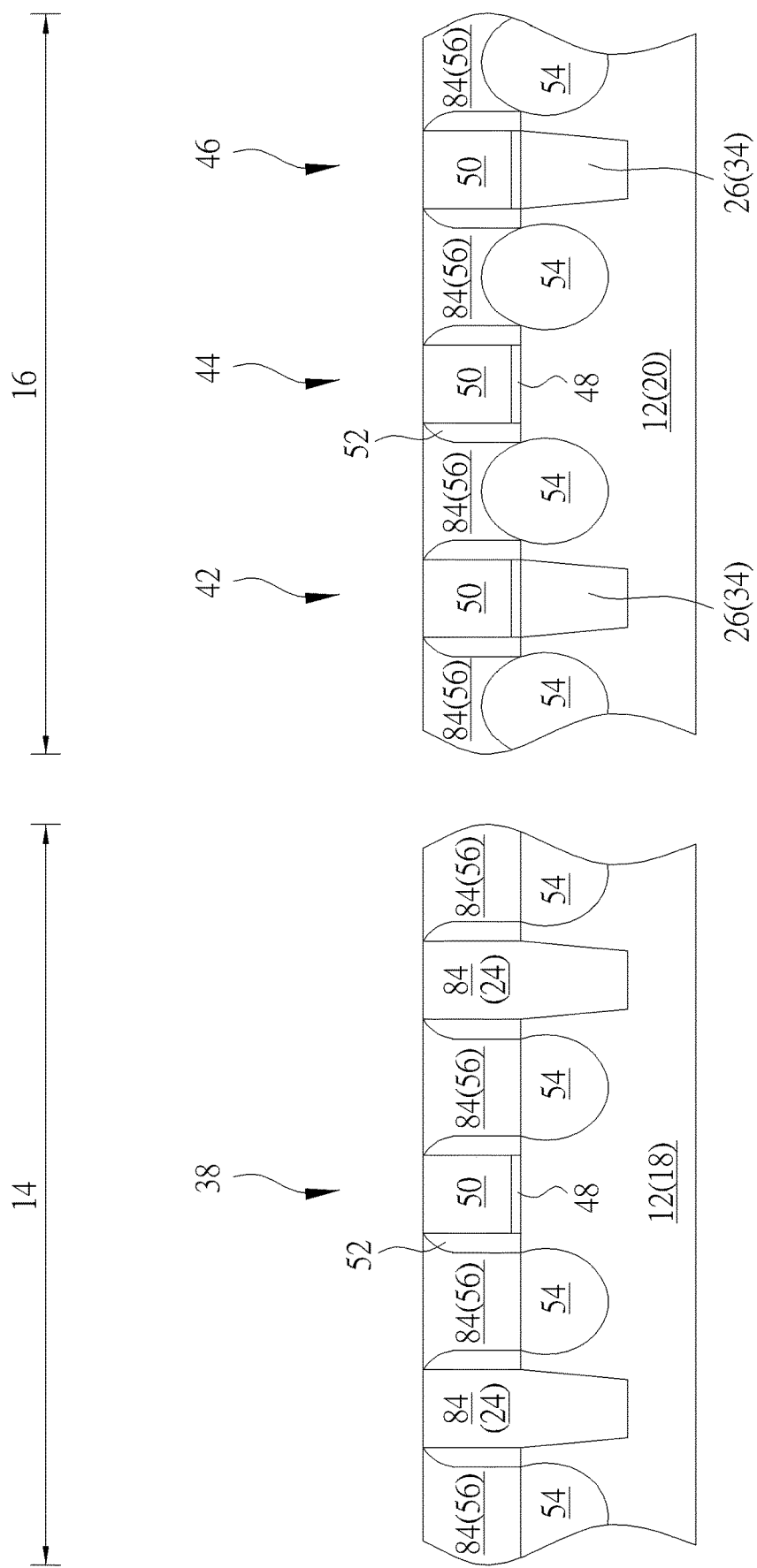

Next, as shown in FIG. 5, a planarizing process such as CMP process is conducted to remove part of the dielectric layer 84 so that the top surface of the remaining dielectric layer 84 filled into the trenches 82 is even with the top surface of the spacers 52. This forms SDB structures 24 on the NMOS region 14 and at the same time forms an interlayer dielectric (ILD) layer 56 around the gate structures 38, 42, 44, 46 on the NMOS region 14 and PMOS region 16. It should be noted that since the SDB structures 24 and the ILD layer 56 are formed through the same process the two elements 24 and 56 are preferably made of same material. Nevertheless, the SDB structures 24 on the NMOS region 14 and the SDB structures 26 on the PMOS region 16 could be made of same material or different material depending on the demand of the product. For instance, the SDB structures 24 and the ILD layer 56 on the NMOS region 14 are preferably made of silicon oxide while the SDB structures 26 on the PMOS region 16 are made of silicon nitride (SiN) or silicon carbon nitride (SiCN) in this embodiment. Nevertheless, according to an embodiment of the present invention, the SDB structures 24 on the NMOS region 14, the ILD layer 56, and the SDB structures 26 on the PMOS region 16 could all be selected from the group consisting of SiO$_2$, SiN, SiCN, and silicon oxycarbonitride (SiOCN).

It should be noted that even though the bottom surface of the SDB structures 24 on NMOS region 14 is even with the SDB structures 26 on PMOS region 16 while the top surface of the SDB structures 24 is even with the top surface of the ILD layer 56 in this embodiment, according to other embodiment of the present invention the height of the SDB structures 24 could also be adjusted depending on the demand of the product. For instance, it would also be desirable to adjust the position of the bottom portion of the SDB structures 24 so that the bottom surface of the SDB structures 24 could be slightly lower than or higher than the bottom surface of the SDB structures 26 on PMOS region 16 while the top surface of the SDB structures 24 is even with the top surface of the ILD layer 56, which are all within the scope of the present invention.

Figure 6:
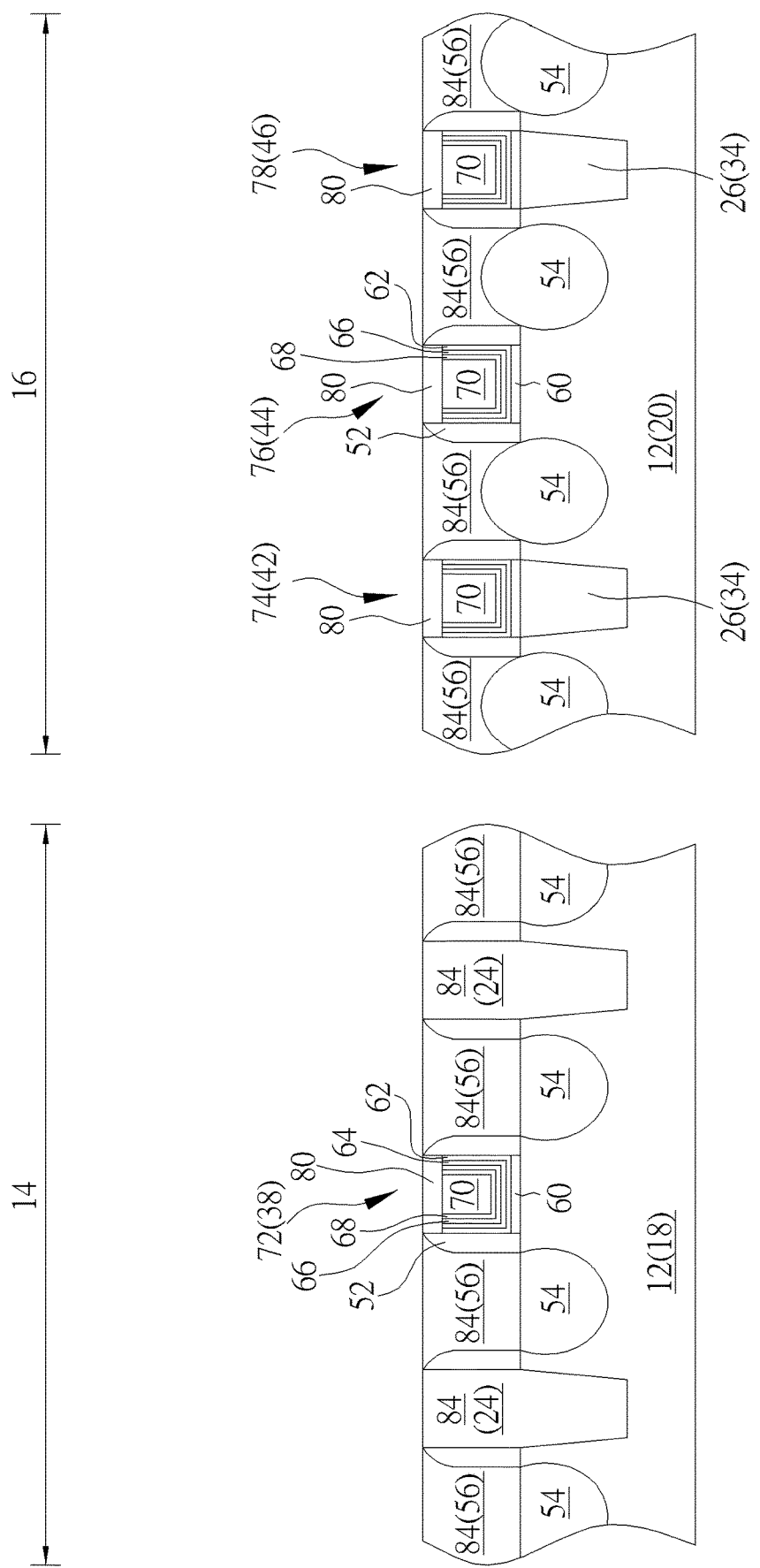

Next, as shown in FIG. 6, a replacement metal gate (RMG) process is conducted to transform the gate structure 38 on NMOS region 14 and gate structures 42, 44, 46 on PMOS region 16 into metal gates. For instance, the RMG process could be accomplished by first performing a selective dry etching or wet etching process using etchants including but not limited to for example ammonium hydroxide (NH$_4$OH) or tetramethylammonium hydroxide (TMAH) to remove the gate material layer 50 or even gate dielectric layer 48 from gate structure 38 on NMOS region 14 and gate structures 42, 44, 46 on PMOS region 16 for forming recesses (not shown) in the ILD layer 56. Next, a selective interfacial layer 60 or gate dielectric layer (not shown), a high-k dielectric layer 62, a selective barrier layer (not shown), and a work function metal layer 64 are formed in the recesses on NMOS region 14 and PMOS region 16, another patterned mask (not shown) such as a patterned resist is formed to cover the NMOS region 14, an etching process is conducted to remove the work function metal layer 64 on PMOS region 16, the patterned mask is removed, and another work function metal layer 66 is formed on the NMOS region 14 and PMOS region 16. Next, another barrier layer 68 such as a top barrier metal (TBM) layer and a low resistance metal layer 70 are formed to fill the recesses completely.

In this embodiment, the high-k dielectric layer 62 is preferably selected from dielectric materials having dielectric constant (k value) larger than 4. For instance, the high-k dielectric layer 62 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

Preferably, the work function metal layers 64 and 66 are formed for tuning the work function of the metal gate in accordance with the conductivity of the device. In this embodiment, the work function metal layer 64 is preferably an n-type work function metal layer having a work function ranging between 3.9 eV and 4.3 eV, which may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. The work function metal layer 66 on the other hand is a p-type work function metal layer having a work function ranging between 4.8 eV and 5.2 eV, which may include titanium nitride (TiN), tantalum nitride (TaN), or tantalum carbide (TaC), but not limited thereto. The optional barrier layer disposed between the high-k dielectric layer 62 and work function metal layer 64 and the barrier layer 68 disposed between the work function metal layer 66 and low resistance metal layer 70 could include titanium (Ti), titanium nitride (TiN), tantalum (Ta) or tantalum nitride (TaN). Furthermore, the low-resistance metal layer 70 may include copper (Cu), aluminum (Al), titanium aluminum (TiAl), cobalt tungsten phosphide (CoWP) or any combination thereof.

Next, a planarizing process such as CMP is conducted to remove part of low resistance metal layer 70, part of the barrier layer 68, part of the work function metal layer 66, part of the work function metal layer 64, and part of the high-k dielectric layer 62 to form gate structure 38 made of metal gate 72 on the fin-shaped structures 18 on NMOS region 14 and gate structures 42, 44, 46 made of metal gates 74, 76, 78 directly on top of the SDB structures 26 and fin-shaped structures 20 on PMOS region 16.

Next, part of the gate structures 38, 42, 44, 46 made of metal gates are removed and a deposition process along with a planarizing process are conducted to formed a hard mask 80 made of silicon nitride on each of the gate structures 38, 42, 44, 46. Next, contact plug formation and metal-interconnect process could be conducted to form contact plugs adjacent to two sides of the metal gates 72, 74, 76, 78 in the ILD layer 56 to electrically connect the source/drain regions 54 on NMOS region 14 and PMOS region 16 and metal interconnections electrically connected to the contact plugs on the ILD layer 56. This completes the fabrication of a semiconductor device according to an embodiment of the present invention.

Referring again to FIG. 6, FIG. 6 further illustrates a structural view of a semiconductor device according to an embodiment of the present invention. As shown in FIG. 6, the semiconductor device includes a NMOS region 14 a PMOS region 16 defined on the substrate 12, fin-shaped structures 18 disposed on the NMOS region 14 and fin-shaped structures 20 disposed on the PMOS region 16, SDB structures 24 disposed on the NMOS region 14 and SDB structures 26 disposed on the PMOS region 16, a gate structure 38 disposed on the fin-shaped structures 18 on NMOS region 14, gate structures 42, 44, 46 disposed on the fin-shaped structures 20 on PMOS region 16, and an ILD layer 56 surrounding the gate structures 38, 42, 44, 46.

In this embodiment, the SDB structures 24 and SDB structures 26 preferably have different heights, in which the bottom surfaces of the SDB structures 24, 26 are preferably coplanar within the substrate 12 while the top surface of SDB structures 24 is even with the top surfaces of the ILD layer 56, spacers 52, and gate structures 38, 42, 44, 46 and/or hard masks 80 and the top surface of the SDB structures 26 is even with the top surface of the substrate 12 and/or fin-shaped structures 20. Preferably, the SDB structures 24 and the ILD layer 56 are made of same material while the SDB structures 24 and 26 are made of different materials. For instance, the SDB structures 24 and the ILD layer 56 are preferably made of silicon oxide and the SDB structures 26 are made of SiN or SiCN.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a first region and a second region;
   forming a first fin-shaped structure on the first region and a second fin-shaped structure on the second region;
   forming a second single diffusion break (SDB) structure in the second fin-shaped structure;
   forming a first gate structure and a second gate structure on the first fin-shaped structure after forming the second SDB structure;
   using a patterned mask to remove the first gate structure and part of the first fin-shaped structure to form a first trench; and
   forming a first dielectric layer in the first trench to form a first single diffusion break (SDB) structure and around the second gate structure.

2. The method of claim 1, further comprising:
   removing part of the second fin-shaped structure to form a second trench;
   forming a second dielectric layer in the second trench; and
   planarizing the second dielectric layer to form the second SDB structure.

3. The method of claim 2, wherein the first fin-shaped structure and the second fin-shaped structure are disposed extending along a first direction and the first SDB structure and the second SDB structure are disposed extending along a second direction.

4. The method of claim 3, wherein the first direction is orthogonal to the second direction.

5. The method of claim 2, wherein the first SDB structure and the second SDB structure comprise different materials.

6. The method of claim 2, further comprising:
   forming the first gate structure and the second gate structure on the first region and a third gate structure on the second SDB structure;
   forming the patterned mask on the first region and the second region;
   using the patterned mask to remove the first gate structure and part of the first fin-shaped structure to form the first trench;
   forming the first dielectric layer in the first trench and around the second gate structure and the third gate structure;
   performing a replacement metal gate (RMG) process to transform the second gate structure and the third gate structure into metal gates.

7. The method of claim 1, further comprising performing a flowable chemical vapor deposition (FCVD) process to form the first dielectric layer.

8. The method of claim 1, further comprising planarizing the first dielectric layer to form the first SDB structure and an interlayer dielectric (ILD) layer around the second gate structure.

9. The method of claim 1, wherein the first region comprises a NMOS region and the second region comprises a PMOS region.

* * * * *